US005774792A

United States Patent [19]

Tanaka et al.

[11] Patent Number: 5,774,792
[45] Date of Patent: Jun. 30, 1998

[54] LOW DISTORTION SWITCH

[75] Inventors: Satoshi Tanaka, Kokubunji; Tatsuto Okamoto; Taro Kitayama, both of Yokohama; Masao Yamane, Takasaki, all of Japan

[73] Assignee: Hitachi, Ltd., Tokyo, Japan

[21] Appl. No.: 514,194

[22] Filed: Aug. 11, 1995

[30] Foreign Application Priority Data

Aug. 29, 1994 [JP] Japan .................................. 6-203190

[51] Int. Cl.$^6$ ..................................................... H04B 1/44
[52] U.S. Cl. ............................... 485/78; 485/82; 485/83; 333/103
[58] Field of Search .............................. 455/50.1, 78, 82, 455/83, 501; 333/103, 104; 327/408, 430, 435, 436; 257/275

[56] References Cited

U.S. PATENT DOCUMENTS 4,962,050  10/1990  Geissberger et al. ................. 257/275
5,193,218   3/1993  Shimo .................................... 455/83
5,436,553   7/1995  Pepper et al. .
5,507,011   4/1996  Chigodo et al. ....................... 455/83
5,519,349   5/1996  Nakahara .
5,548,239   8/1996  Kohama ................................. 455/83

Primary Examiner—Chi H. Pham
Assistant Examiner—Gertrude Arthur
Attorney, Agent, or Firm—Fay, Sharpe, Beall, Fagan, Minnich & McKee

[57] ABSTRACT

This invention is intended to realize a high frequency switch with a low distortion characteristic. In an SPDT switch consisting of a plurality of FETs, the FET on the receiver side through which a received signal passes and the shunt FET on the transmitter side are each formed of series-connected FETs, and a capacitor is connected between the first gate and the source and between the second gate and the drain. An inductance is connected in parallel with a series connection of FETs. This easily realizes a high frequency switch having a low voltage and a low distortion characteristic. The 1 dB compression level, an index of input-output characteristic, can be improved more than 5 dB over the conventional SPDT switch at an input level.

12 Claims, 16 Drawing Sheets $Von(+) = (Vth - Vcon)(Cgd + Cgs)/Cgs$
$Von(-) = (Vcon + abs(Vth)(Cgd + Cgs)/Cgs$ $Von(+) = (Vth-Vcon)CM/(Cg1d1*Cg2d2)$
$Von(-) = (Vcon+abs(Vth))CM/(Cg1s*Cg1d1*Cg2d1)$

LOW DISTORTION SWITCH

BACKGROUND OF THE INVENTION

(1) Field of the Invention

The present invention relates to a switch used in terminals for mobile communication systems to switch between transmission and receiving modes and more particularly to a high-frequency switch having low distortion characteristics.

(2) Description of the Prior Art

Many reports have been made public on the development of a single-pole double-throw switch (abbreviated SPDT switch) using GaAs devices for switching between transmission and receiving modes, whose main applications include cellular telephones and cord-less telephones. One such example is the "Small Resin Packaged High-Frequency FET Switch," by Yoshikawa, et al., proceedings of the 1994 IEICE Spring Conference, Lecture Number C-90.

FIG. 2 shows a circuit configuration of a conventional SPDT switch. FETs FET1, FET2, FET3, FET4 making up the SPDT switch are depression GaAs MESFETs. By referring to FIG. 2, the working principle of the SPDT switch is explained. The SPDT switch includes three signal nodes 1, 2, 3 and two control nodes VC1, VC2. The signal node 2 is connected to an antenna, the signal node 1 is connected to a receiver, and the signal node 3 is connected to a transmitter. The two control nodes VC1, VC2 are applied with a 0 V bias or a negative bias Vcon lower than the threshold voltage of each FET Vth, complementarily, as a control bias. When the control node VC1 is applied with 0 (V) and the control node VC2 with Vcon (V), FET2 and FET4 turn on and FET1 and FET3 turn off, connecting the signal node 2 and the signal node 1 and introducing a received signal from the antenna to the receiver (receiving mode). Conversely, when the control node VC1 is applied with Vcon (V) and the control node VC2 with 0 (V), FET1 and FET3 turn on and FET2 and FET4 turn off, connecting the signal node 2 and the signal node 3 and introducing a sending signal from the transmitter to the antenna (transmitting mode).

FIG. 3A shows a small signal equivalent circuit for each FET. As shown in FIG. 3, a simplified equivalent circuit with FET off can be represented by a parasitic capacitor between drain and source. The insertion loss of the SPDT switch is determined by parasitic capacitor and parasitic resistor between drain and source of each FET.

FIG. 3B shows a small signal equivalent circuit of a conventional SPDT switch in the receiving mode. Reducing the parasitic resistance of ON-state FET on either the transmitter or receiver side results in an increase in the gate width of FET, which in turn increases the parasitic capacitor of the OFF-state FET. Hence, the insertion loss on the transmitter side and the insertion loss on the receiver side are in the trade-off relation in terms of gate width of each FET.

Next, the distortion mechanism during the large-signal operation of the conventional SPDT switch is described below. The main cause of distortion of the SPDT switch lies in the OFF-state FET. That is, in the transmitting mode, the distortion is caused by a shunt FET on the transmitter side and a through FET on receiving mode on the receiver side. The shunt FET and the through FET on receiving mode correspond to FET4 and FET2 in FIG. 2.

FIG. 4A and 4C show the OFF-state shunt FET on the transmitter side. By referring to these figures, the distortion mechanism is described.

First, let us consider a case where the frequency of the input signal is sufficiently low so that the parasitic capacitor of FET can be ignored (FIG. 4A). The source node of OFF-state FET is at a ground level (Vs=0). At this time, FET is impressed with a large amplitude of waveform, and a large voltage is applied to its drain.

(1) When the voltage applied to drain is negative:

When the voltage Vd applied to the drain is lower than VCon+abs (Vth), where Vcon is control bias, current starts to flow to the drain side. Thus, as shown in FIG. 4B, the waveform distorts in a negative region. This condition is expressed as follows.

$$V_d \leq V_{con} + abs(V_{th}) \quad \text{(Expression 1)}$$

(2) When the voltage applied to drain is positive:

Basically FET does not turn on as long as the breakdown voltage level is not exceeded. The results are summarized in FIG. 4B. Distortion occurs only when the voltage applied to drain is lower than the voltage Von(−) at which the (Expression 1) with equality sign holds.

Next, let us consider a case where the frequency of input signal is high so that the influence of FET parasitic capacitor cannot be ignored (FIG. 4C). In this case, what influences the distortion mechanism is a gate-drain capacitance Cgd and a gate-source capacitance Cgs. It is assumed that the control bias Vcon is supplied through a resistor sufficiently large compared with the parasitic capacitor. At this time, the gate voltage Vg is given by $$Vg = V_{con} + \frac{V_d * C_{gd}}{C_{gd} + C_{gs}} \quad \text{(Expression 2)}$$

(1) When the voltage applied to drain is negative:

The condition in which FET turns on causing the current to flow out of the drain is given by $$V_d \leq V_g + abs(V_{th}) \quad \text{(Expression 3)}$$

Combining (Expression 2) and (Expression 3) results in $$V_d \leq \frac{(V_{con} + abs(V_{th}))(C_{gd} + C_{gs})}{C_{gs}} \quad \text{(Expression 4)}$$

It is seen that FET can withstand signals that are (Cgd+ CGs)/Cgs times greater in voltage magnitude than the signals at low frequency.

(2) When the voltage applied to drain is positive:

The condition under which the gate voltage Vg increases and FET turns on to cause the current to flow in to drain is given by $$V_g \geq V_{th} \quad \text{(Expression 5)}$$

Combining (Expression 2) and (Expression 5) results in $$V_d \geq \frac{(V_{th} - V_{con})(C_{gd} + C_{gs})}{C_{gd}} \quad \text{(Expression 6)}$$

At low frequency, the input signal can be close to the limit of drain breakdown voltage. In this case, however, the impedance of parasitic capacitor cannot be ignored and the gate voltage Vg is influenced by the drain voltage Vd and increases, turning on the FET and distorting the signal.

The voltages that satisfy the equality sign condition of (Expression 4) and (Expression 6) are assumed to be Von(−) and Von(+). The input and output waveforms are shown in FIG. 4D. As shown, the conventional SPDT switch suppresses the dynamic range of voltage applied to the terminals of FET4 and FET2 in FIG. 2 according to (Expression 4) and (Expression 6). Hence, it is necessary to deepen the control bias Vcon or shallow the threshold voltage Vth to lower distortion.

Considering the application of SPDT switch to mobile communication systems, power consumption should be reduced and this puts demands on the circuit for lower voltage, which in turn requires the control bias voltage to be lowered. Shallowing the threshold voltage increases the resistance of ON state, giving rise to another problem of increased insertion loss.

A typical prior art to solve this problem involves using a plurality of FET connected in series, not a single FET, to realize ON-state and OFF-state. One such conventional example is introduced in "High performance, low cost GaAs MMICs for personal phone applications at 1.9 GHz," by C. Kermarrc, Institute of Physics Conference Series Number 129, pp.911–916. This conventional example is shown in FIG. 7A. To explain this example, the distortion mechanism of OFF-state FET shown in FIG. 4 and the countermeasure are reexamined here. Looking at the term (Cgd+Cgs)/Cgs in (Expression 4), it is seen that by increasing Cgd compared with Cgs it is possible to suppress the phenomenon in which the FET is erroneously turned on when the drain voltage Vd is deflected to the negative side.

Similarly, looking at the term (Cgd+Cgs)/Cgd in (Expression 6), it is seen that by increasing, this time, Cgs compared with Cgd it is possible to suppress the phenomenon in which the FET is erroneously turned on when the drain voltage Vd is deflected to the positive side.

The above two effects are realized by increasing the number of FETs which may have the problem of distortion and connecting them in series. In FIG. 7B, three FETs are connected in series. It is also known, as indicated in Japan Patent Laid-Open No. 45872/1994, that the effect can be enhanced by connecting the sources of two FETs and adding a capacitor between drain and gate of each FET. This conventional example is shown in FIG. 7B.

SUMMARY OF THE INVENTION

Constructing the SPDT switch by applying the above-mentioned conventional technology to solve the problem of distortion requires increasing the gate width to reduce series parasitic resistance, which in turn results in an increased parasitic capacitance. When the sources of two FETs are connected and a capacitor is added between the drain and gate of each FET, as shown in FIG. 7B, a large voltage is impressed between gate and source of each FET, giving rise to a problem that a large signal input may result in FET breakdown.

This invention solves the problem of increased parasitic capacitance by connecting an inductor in parallel with a series connection of FETs. The problem of breakdown is improved by putting drains opposite each other and connecting them.

Here, we will discuss the conventional method of dealing with the SPDT switch distortions in detail and reveal its problem. As described earlier, the major cause for distortions in the SPDT switch lies in the OFF-state FET. Let us examine the operation when this section is replaced with a plurality of cascode-connected FETs. FIG. 5A shows two OFF-state FETs connected in series.

First, we consider a case where the frequency of input signal is sufficiently low so that the parasitic capacitors of the FETs are negligible. Two gates G1, G2 are both biased to Vcon (V). The source nodes of the OFF-state FETs are at the ground level (Vs=0).

(1) When the voltage applied to drain is negative:

When the drain voltage Vd2 is less than Vcon+Abs(Vth), where Vcon is a control bias, current starts to flow to the drain side. This phenomenon is what occurs with a single FET. At low frequency, no effect is produced if a plurality of FETs are connected in series.

(2) When the voltage applied to drain is positive:

As with the case of a single FET, the FET basically will not turn on as long as the breakdown voltage level is not exceeded.

Next, we consider a case where the frequency of input signal is high so that the influence of parasitic capacitor of FET cannot be ignored (FIG. 5A). In this case, what influences the distortion is four parasitic capacitors Cg1s, Cg1d1, Cg2d1, Cg2d2. It is assumed that the control bias Vcon is supplied through a resistor sufficiently large compared with the parasitic capacitor.

(1) When the voltage applied to drain D2 is negative.

The gate voltage of the second gate G2, Vg2, is given by $$V_{g2} = V_{con} + V_{d2} * \left(1 - \left(\frac{C_{g1s}*C_{g1d1}*C_{g2d1}}{CM}\right)\right) \quad \text{(Expression 7)}$$

$$CM = C_{g1d1}*C_{g2d1}*C_{g2d2} + C_{g1s}*C_{g1d1}*C_{g2d1} + C_{g1s}*C_{g2d1}*C_{g2d2} + C_{g1s}*C_{g1d1}*C_{g2d2}$$

The condition in which the FET is turned on to allow current to flow out of drain D2 is given by $$V_{d2} \leq V_{g2} + abs(V_{th}) \quad \text{(Expression 8)}$$

Combining (Expression 7) and (Expression 8) results in $$V_{d2} \leq \frac{(V_{con} + abs(V_{th}))*CM}{(C_{g1s}*C_{g1d1}*C_{g2d1})} \quad \text{(Expression 9)}$$

This shows that the FET can withstand the input signal with a voltage magnitude $CM/(C_{g1s}*C_{g1d1}*C_{g2d1})$ times greater than that at the low frequency.

(2) When the voltage applied to drain D2 is positive:

The gate voltage of the first gate G1, Vg1, is given by $$V_{g1} = V_{con} + V_{d2} * \left(\frac{C_{g1d1}*C_{g2d1}*C_{g2d2}}{CM}\right) \quad \text{(Expression 10)}$$

$$CM = C_{g1d1}*C_{g2d1}*C_{g2d2} + C_{g1s}*C_{g1d1}*C_{g2d1} + C_{g1s}*C_{g2d1}*C_{g2d2} + C_{g1s}*C_{g1d1}*C_{g2d2}$$

The condition in which the gate voltage of the first gate G1, Vg1, increases and the FET turns on allowing the current to flow into the drain D2 is given by $$V_{g1} \geq V_{th} \quad \text{(Expression 11)}$$

Combining (Expression 10) and (Expression 11) results in $$V_{d2} \geq (V_{th} - V_{con})\left(\frac{CM}{C_{g1d1}*C_{g2d1}*C_{g2d2}}\right) \quad \text{(Expression 12)}$$

The voltage that satisfy the equality sign condition of (Expression 9) and (Expression 12) are assumed to be Von(−) and Von(+). The input waveform to the input node in FIG. 5A and the output waveform from the output node are shown in FIG. 5B.

The effect of replacing one FET with two FETs connected in series is considered. If we assume that Cg1s=Cg1d1=Cg2d1=Cg2d2=1 for simplicity, the condition under which the OFF-state FET turns on is as follows.

(1) When the voltage applied to drain D2 is negative:
One FET: $V_d \leq (V_{con} + \text{abs}(V_{th}))*2$
Two FETS: $V_{d2} \leq (V_{con} + \text{abs}(V_{th}))*4$
(2) When the voltage applied to drain D2 is positive:
One FET: $V_d \leq (V_{th} - V_{con})*2$
Two FETs: $V_{d2} \leq (V_{th} - V_{con})*4$ This indicates that using two FETs improves the condition of the drain voltages Vd, Vd2 two times.

A qualitative explanation on the distortion characteristics improvement mechanism is given as follows. When the drain D2 is applied a negative voltage, the second gate G2 is applied an impedance between gate 2 and ground Zg2gnd and also superimposed with the AC signal bred by the impedance between drain and gate 2 Zd2g2. Hence, when the drain voltage Vd2 changes, the second gate G2 follows it. When two FETs are connected in series, Zg2gnd is formed of a series connection of Cg1s, Cg1d1 and Cg2d1, and Zd2g2 is an impedance of Gg2d2. Hence, Zd2g2 becomes comparatively smaller than Zg2gn and the capability of the second gate voltage Vg2 to follow the drain D2 enhances, with the result that the switch does not easily turn on.

Similar logic holds true when a positive voltage is applied to the drain D2. When a positive voltage is impressed on the drain D2, the first gate G1 is applied an impedance between gate 1 and ground Zg1gnd and superimposed with an AC signal bred by the impedance between drain and gate 1 Zd2g1. Thus, when the drain voltage Vd2 changes, the first gate G1 follows its change and increases its voltage. When two FETs are connected in series, Zd2g1 is formed of a series connection of Cg1d1, Cg2d1 and Cg2d2, and Zg1gnd is an impedance of Cg1s. Hence, Zg1gnd becomes comparatively larger than Zd2g1 and the capability of the first gate voltage Vg1 to follow the drain D2 reduces, with the result that the switch does not easily turn on.

Although the above description concerns the case of two FETS connected in series, the conventional example of three FETS connected in series shown in FIG. 7A is also based on the same working principle. The conventional example of FIG. 7B, though the connection of drain and source of each FET is reversed, corresponds to FIG. 5A with Cg1s and Cg2d2 added.

For further improvement of distortion characteristics, methods are available, one of which increases the number of FETs connected in series to improve the breeder ratio and another increases Cg1s and Cg2d2 to improve the breeder ratio.

In the case of increasing Cg1s and Cg2d2, its effect is examined by taking up an example. When Cg1d1=Cg2d1=1 and Cg1s=Cg2d2=2, the following conditions hold.

(1) When the voltage applied to drain D2 is negative:
Two FETs: $V_{d2} \leq (V_{con} + \text{abs}(V_{th}))*6$
(2) When the voltage applied to drain D2 is positive:
Two FETs: $V_{d2} \leq (V_{th} - V_{con})*6$ This shows that increasing the capacitance between gate 1 G1 and source S and between gate 2 G2 and drain D2 improves the distortion characteristics.

When the capacitance is increased in this way, the ratio of the voltage differences between nodes Vg1-Vs, Vd1-Vg1, Vg2-Vd1, Vd2-Vd2 are inversely proportional to the capacitances between nodes Cg1s, Cg1d1, Cg2d1, Cg2d2, so that the ratio of the voltage differences is 1:2:2:1. It is seen therefore that Vd1-Vg1 and Vg2-Vd1 increase compared with the voltage differences between other nodes. The calculations so far have used linear capacitor for simplicity, but the actual switch has nonlinear capacitors with bias dependency.

FIG. 6 shows the result of numerical simulation when two GaAs MESFETs with gate width of W=800 μm and threshold voltage of Vth=−2V are connected in series, capacitance of 0.3 pF is added between gate 2 and drain and between gate 1 and source, DC bias of −3V is applied to gate, and 28 dBm is applied to drain. From FIG. 6 it is seen that while the maximum of absolute values of Vg1-Vs and Vd2-Vg2 are 3.1 V and 3.4 V respectively, the Vd1-Vg1 when a positive magnitude is applied is 9.5 V and the Vg2-Vg1 when a negative magnitude is applied is 8.8 V. Hence, a high breakdown voltage characteristic is required between gate and source of FET4-1 and between gate and drain of FET4-2. The GaAs MESFET has the gate-drain distance set greater than the gate-source distance to achieve a high breakdown voltage characteristic. In the conventional switch, in which the source nodes are set opposite each other as shown in FIG. 7B, a high voltage is necessarily applied between gate and source of each FET, making it impossible to provide a sufficient margin for the breakdown voltage. This poses a problem particularly when it is necessary to suppress the loss when a power of more than 1 W (30 dBm) is used, or when it is necessary to suppress harmonic distortions even when power used is only about 100 mW. Further, countermeasures are also required when the gate length of FET is reduced by improved fabrication precision. This invention has the drains set opposite each other and connected together, as shown in FIG. 8A, to solve this problem.

Next, we consider a case of applying the above-mentioned connection to the SPDT switch. In this invention, when the SPDT switch is connected to a signal line leading to the antenna and is used for switching between the transmitting and receiving modes, the circuit of FIG. 8A is applied for the FET that turns off during the transmitting mode, as shown in FIG. 8B. The precise small signal equivalent circuit of what is shown in FIG. 8A in the OFF state is shown in FIG. 9A, and the simplified small signal equivalent circuit is shown in FIG. 9B. As mentioned earlier, when two or more FETs are connected in series to function as a switch, it is necessary to increase the gate width of each FET to reduce the series parasitic resistance in the ON state. In the case of connecting the same FETs in series, it is possible to realize almost the same series parasitic resistance as that of one FET by doubling the gate width. At this time, the parasitic capacitance is nearly equal to that of one FET because the FETs are connected in series. When, however, the proposed circuit is used, the capacitance is connected between each gate and source, the parasitic capacitance increases, degrading the isolation characteristic in the OFF state. This invention solves this problem by connecting inductance in parallel with the circuit of FIG. 8A to improve the isolation characteristics.

The foregoing and other objects, advantages, manner of operation and novel features of the present invention will be understood from the following detailed description when read in connection with the accompanying drawings.

DESCRIPTION OF THE PREFERRED EMBODIMENT

Figure 2:
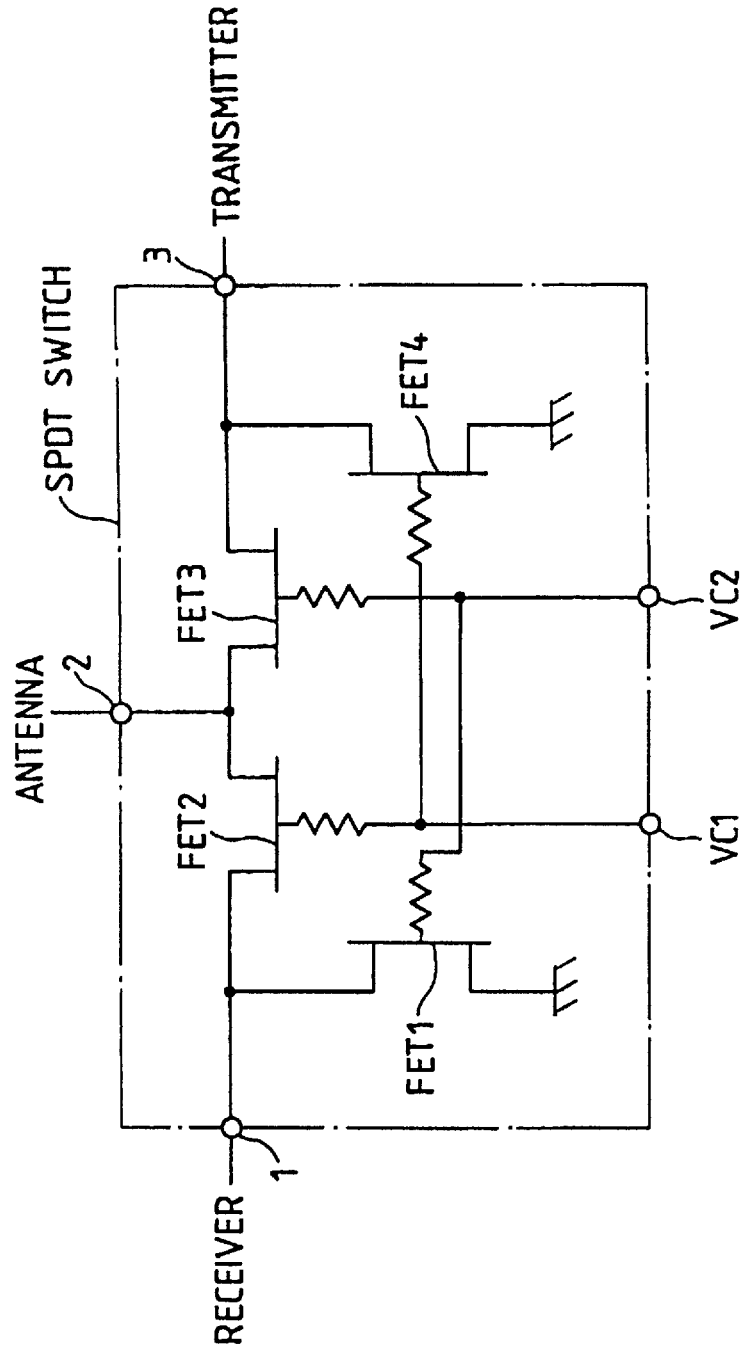
FIG. 2 is a circuit diagram showing a conventional SPDT switch.
Figure 3A:
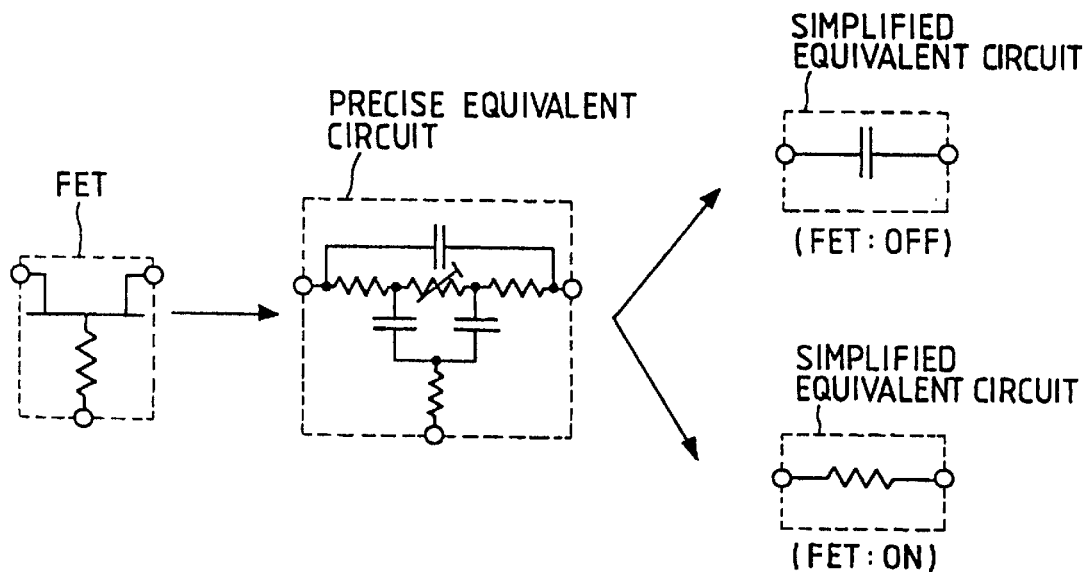
FIGS. 3A and 3B are small signal equivalent circuits of FET and SPDT switch.
Figure 3B:
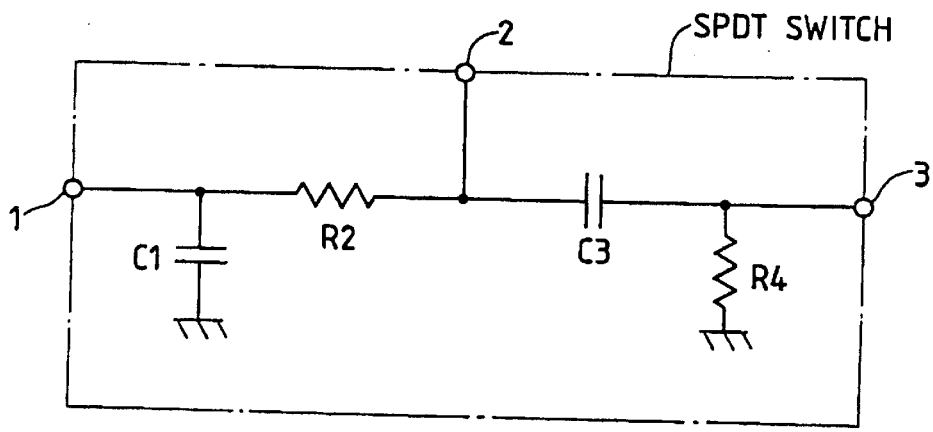
Figure 4B:
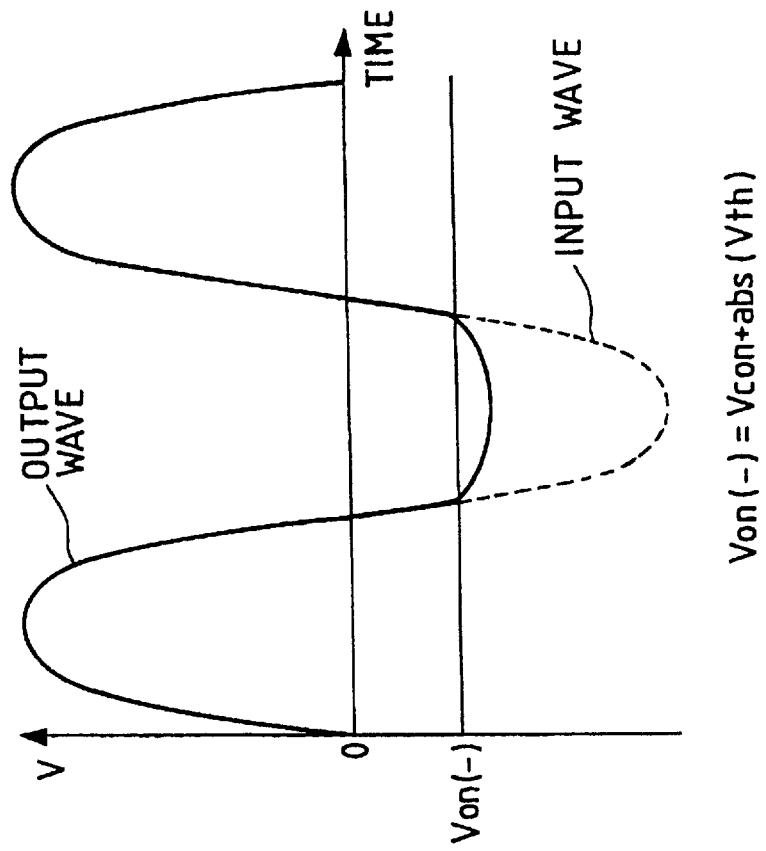
FIGS. 4A, 4B, 4C, 4D are circuit diagrams showing shunt FETs on the transmitter side and input-output waveforms.
Figure 4A:
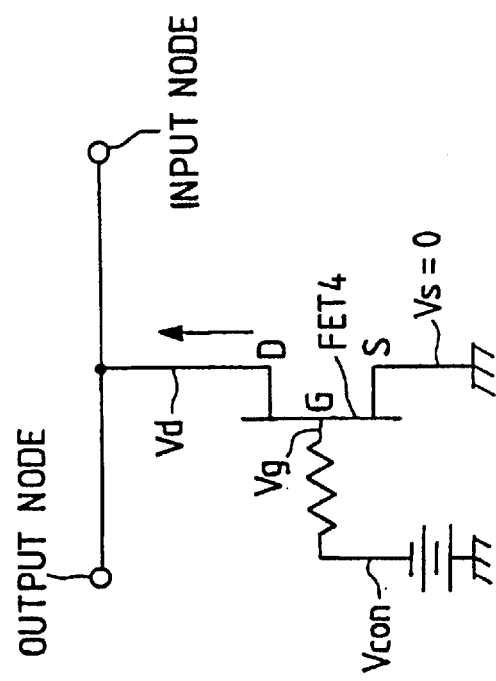
Figure 4D:
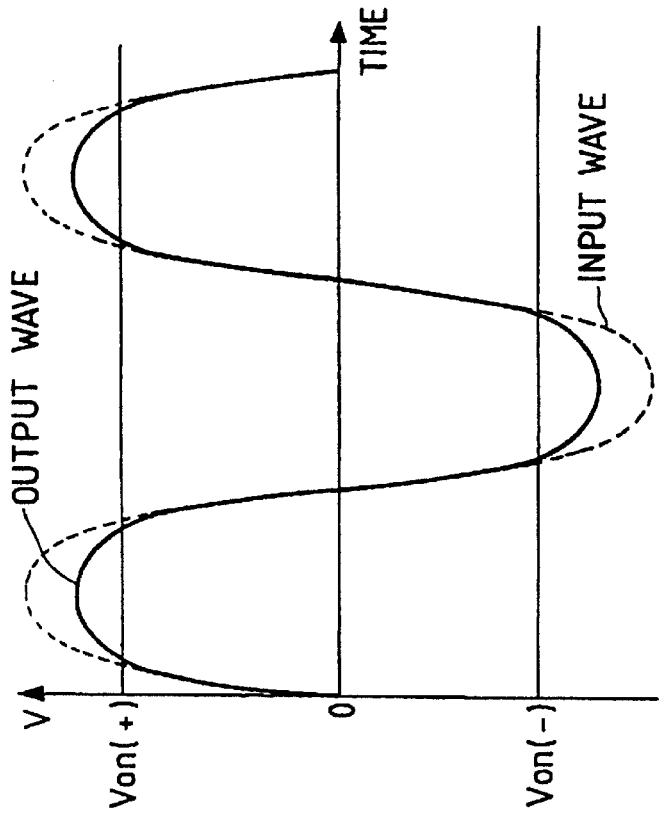
Figure 4C:
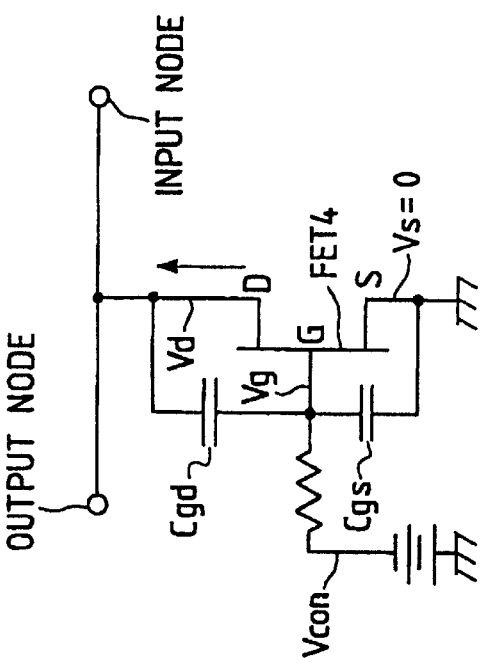
Figure 5B:
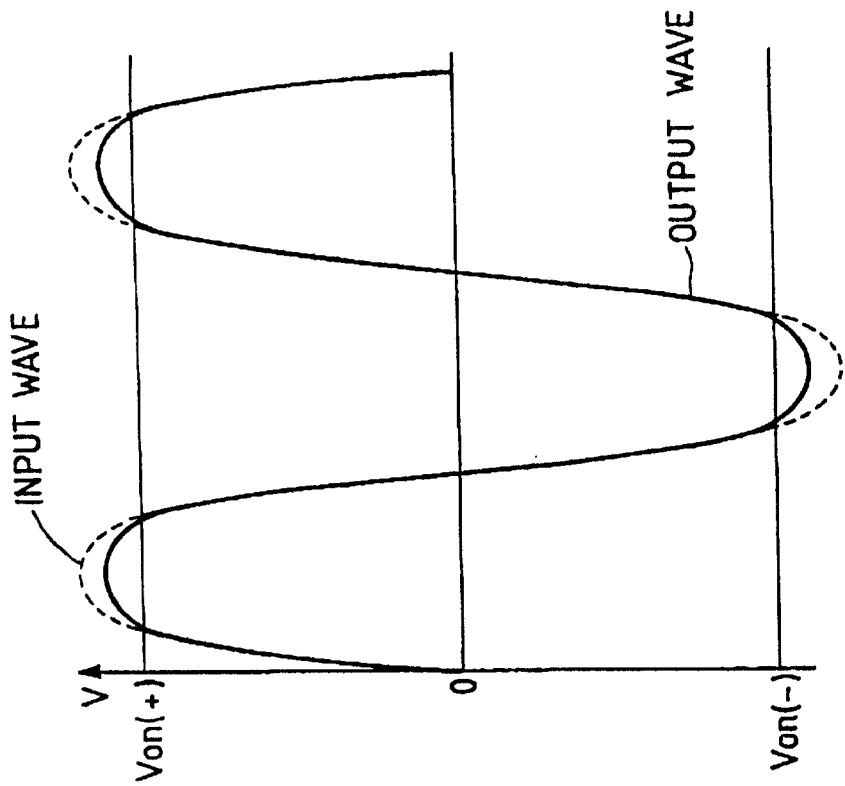
FIG. 5A is a circuit diagram showing a shunt circuit on the transmitter side consisting of two FETs connected in series and FIG. 5B is an input/output waveform diagram.
Figure 5A:
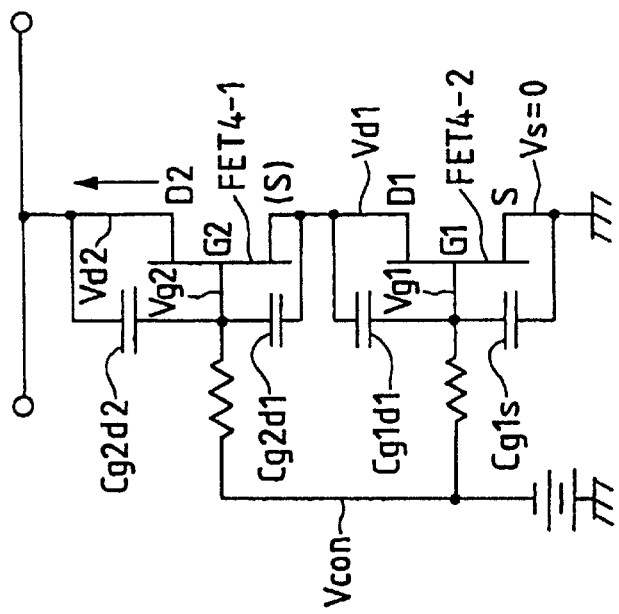
Figure 6:
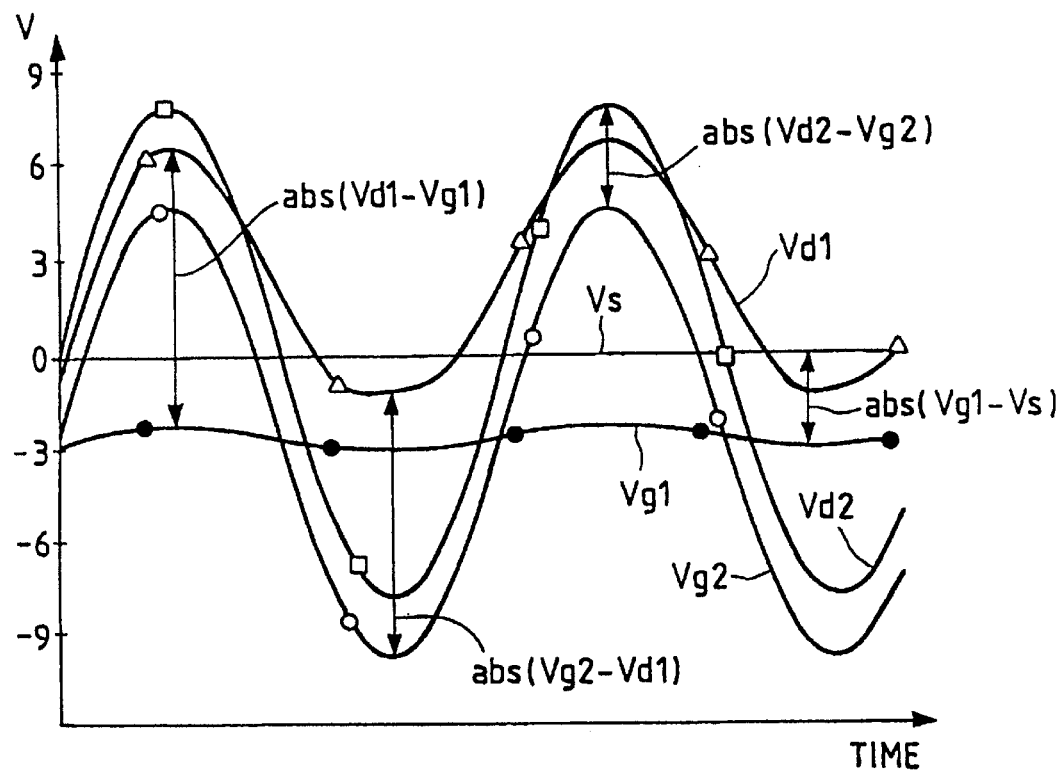
FIG. 6 is a result of calculation simulation of a circuit shown in FIG. 7B.
Figure 7A:
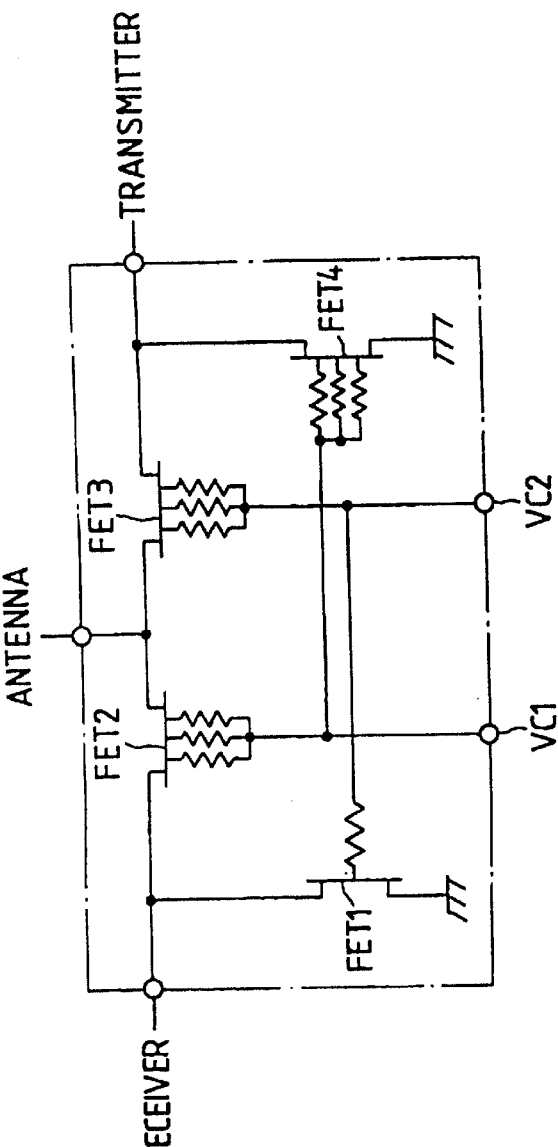
FIGS. 7A and 7B are circuit diagrams showing a conventional distortion lowering technology.
Figure 7B:
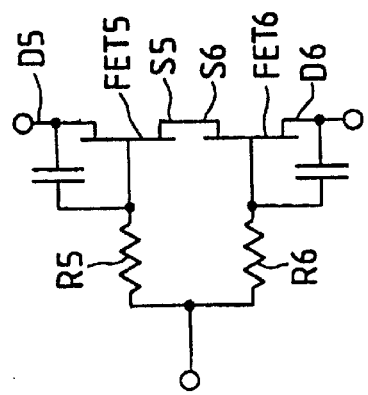
Figure 8A:
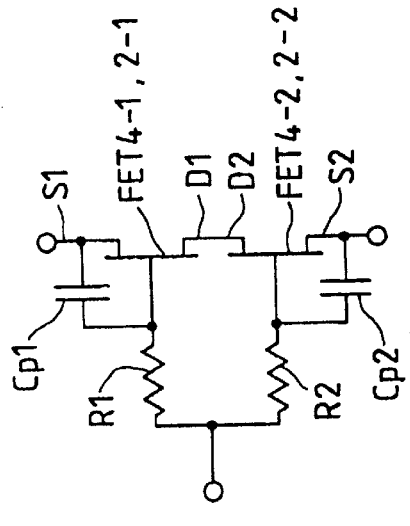
FIGS. 8A and 8B are circuit diagrams of a first embodiment of this invention.
Figure 8B:
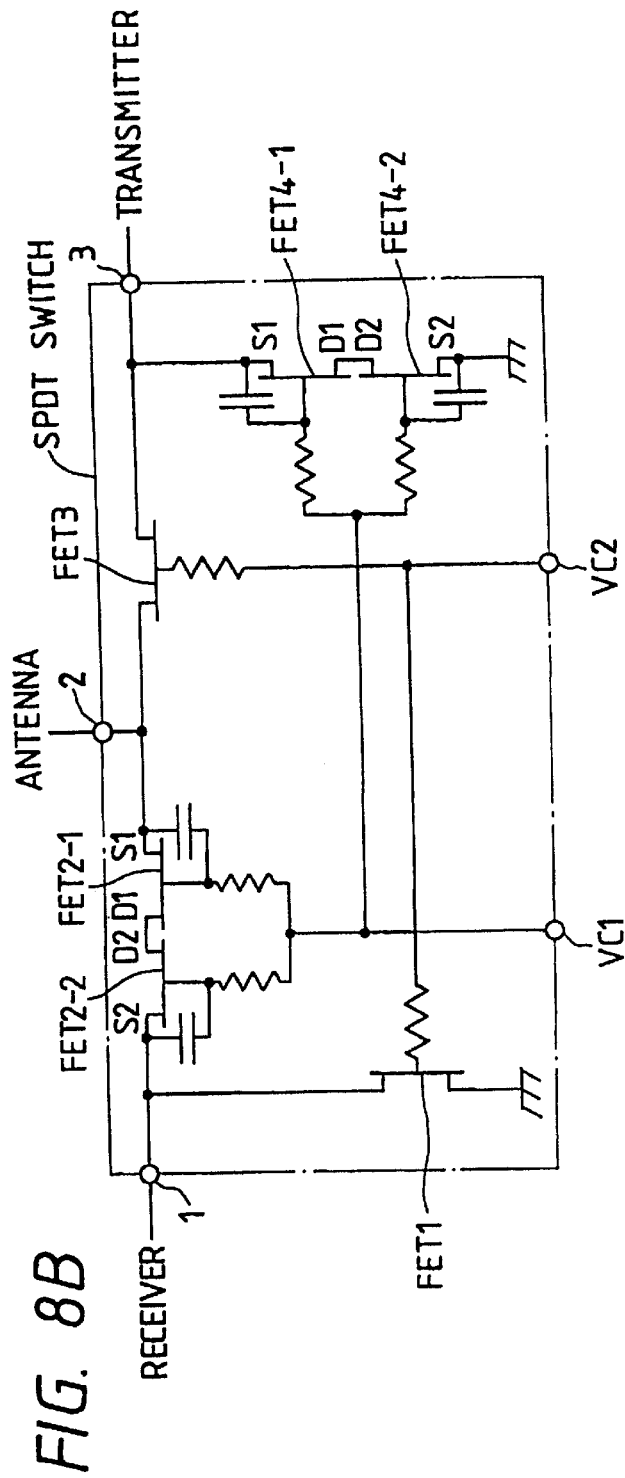
Figure 9A:
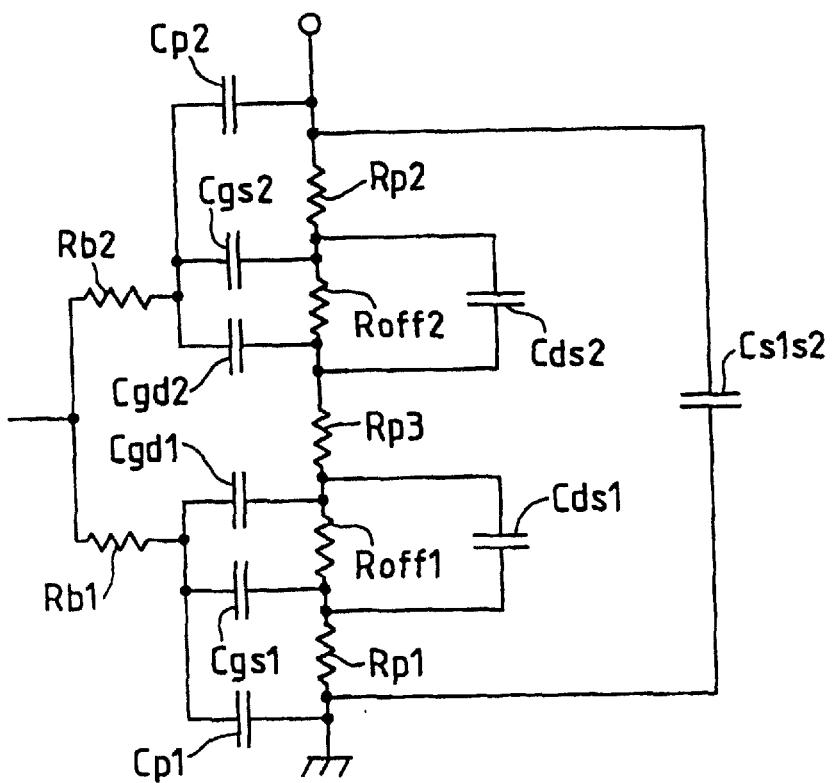
FIGS. 9A and 9B are circuit diagrams showing small signal equivalent circuits of an impedance circuit according to this invention.
Figure 9B:
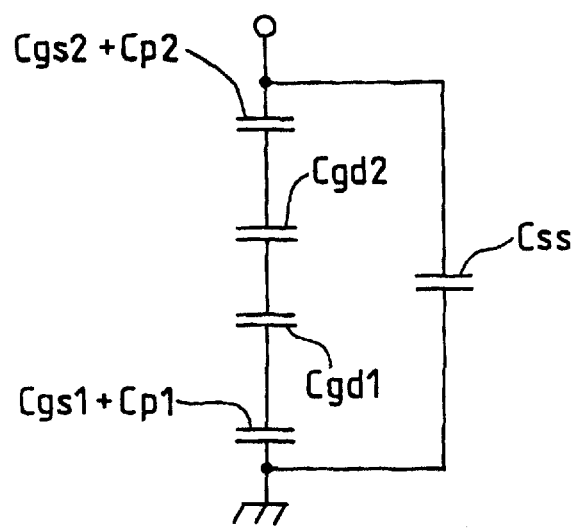

The first embodiment of this invention is described by referring to FIGS. 8A and 8B. As already shown in FIG. 6, when a large-magnitude voltage is impressed across the circuit of FIG. 8A, if a large signal is input to the switch, a large voltage is produced at a connecting portion of two FETs and also between gates of the FETs. Hence, this invention applies an impedance circuit, in which the drains of the two FETs are interconnected to increase the breakdown voltage characteristic at the connecting portion and between the gates. FIG. 18B shows this impedance circuit used in an SPDT switch for switching between the transmitting and receiving modes of a terminal of TDMA (time division multiple access) system. Distortions produced when a large-magnitude signal is applied to the SPDT switch is caused mainly by the OFF-state FET being forcibly turned on by a transmitting signal of high frequency and high power when a terminal is in the transmitting mode. To suppress the generation of this distortion, this invention applies the impedance circuit of FIG. 8A for a portion that corresponds to FET2, 4 of FIG. 2. The capacitors Cp1, Cp2 to alleviate the distortion are added as necessary. When the transmitting output is as small as 10 dBm, there is no need to add the capacitors Cp1, Cp2. The essence of this invention lies in applying the impedance circuit in which drains of FETs are interconnected and in connecting the source of each FET to the transmitter side and the ground level side (or receiver side). A third FET may also be connected between the two FETs to further improve the distortion characteristic. In this case, this invention is valid as long as the drains of the two outer FETs of series-connected FETs are connected to the third inner FET and the sources of the two outer FETs are connected to the transmitter side or ground level side (or receiver side). With this embodiment, it is possible to form a low-distortion and low-loss SPDT switch which eliminates the problem of breakdown voltage that would accompany the SPDT switch made up of a plurality of FETs connected in series.

Figure 1:
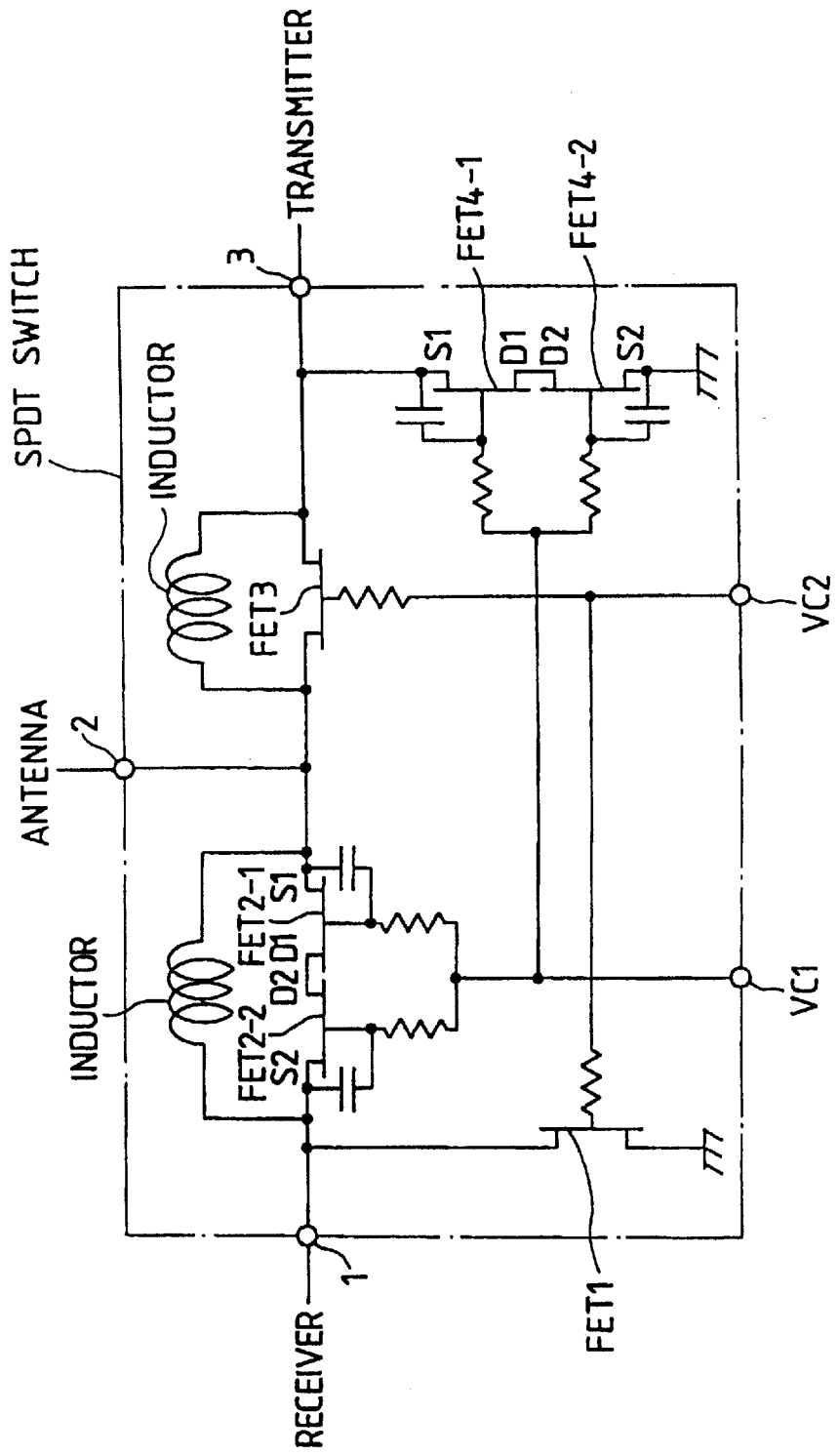
FIG. 1 is a circuit diagram of a second embodiment of this invention.

The second embodiment of this invention is explained by referring to FIG. 1. Although connecting a plurality of FETs in series improves the distortion characteristic, it increases the series parasitic resistance in the ON state and therefore the insertion loss when the receiver and the antenna are connected. To prevent deterioration of the insertion loss, there is a need to increase the gate width of FET2-1, FET2-2 of the impedance circuit. Increasing the gate width and adding the antidistortion capacitors Cp1, Cp2, however, increase the parasitic capacitance between the nodes in the impedance circuit, which in turn deteriorates the isolation characteristics in the OFF state and also worsens the insertion loss during the transmitting mode. To cancel the unwanted effects of the parasitic capacitor, this invention connects an inductor in parallel with the impedance circuit. As to the FET3 that turns on during transmitting mode, because it uses a large gate width for the purpose of reducing the ON-state resistance, it has a parasitic capacitance canceling inductor connected in parallel with the impedance circuit. Detailed comparison with the small signal equivalent circuit of a single FET indicates that the use of a plurality of FETs adds an excess parasitic resistance between the resistance of the operation layer and the gate, increasing the series parasitic resistance in the ON state and therefore the insertion loss. With this embodiment, however, it is possible to form an SPDT switch that realizes low distortion, low loss and high isolation characteristic as well as excellent breakdown voltage characteristic.

Figure 10:
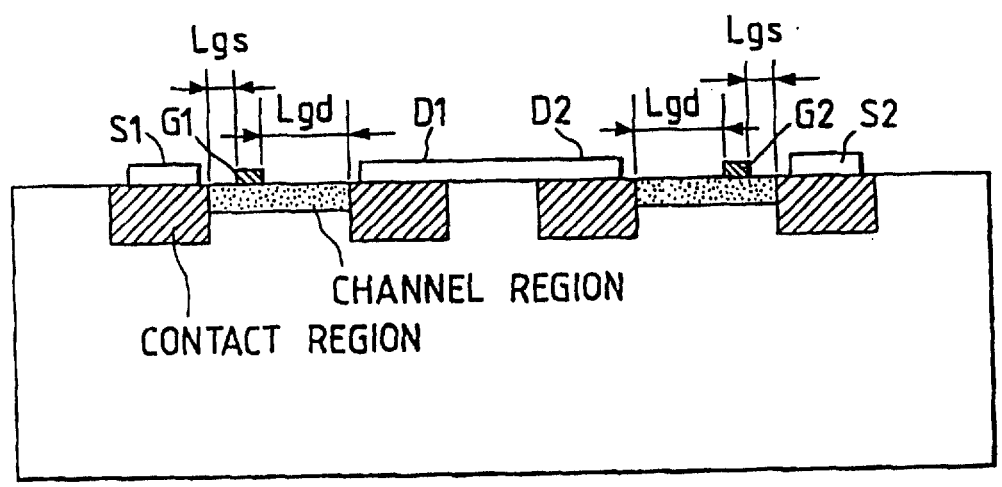
FIG. 10 is a schematic cross section of a third embodiment of this invention.

The third embodiment of this invention is described by referring to FIG. 10. This embodiment represents an example device configuration that realizes the first embodiment. To improve the breakdown voltage of the first embodiment, the distance Lgd between the gate G1, G2 and the drain D1, D2 is set longer than the distance Lgs between the gate G1, G2 and the source S1, S2. When the drain and the source are at the same voltage, the gate-drain capacitor Cgd becomes smaller than the gate-source capacitor Cgs. This embodiment realizes an impedance circuit by setting the gate-drain distance of the two FETs wide and interconnecting the drains of the FETs whose breakdown voltage between gate and drain is improved. Interconnecting the drains of two FETs reduces the parasitic capacitance between the two gates and this embodiment therefore can not only improve the breakdown voltage but also bring the capacitance ratio close to an appropriate one that contributes to the reduction in distortion. By applying the impedance circuit of this embodiment to the SPDT switch, it is possible to realize a switch with an improved distortion characteristic.

Figure 11:
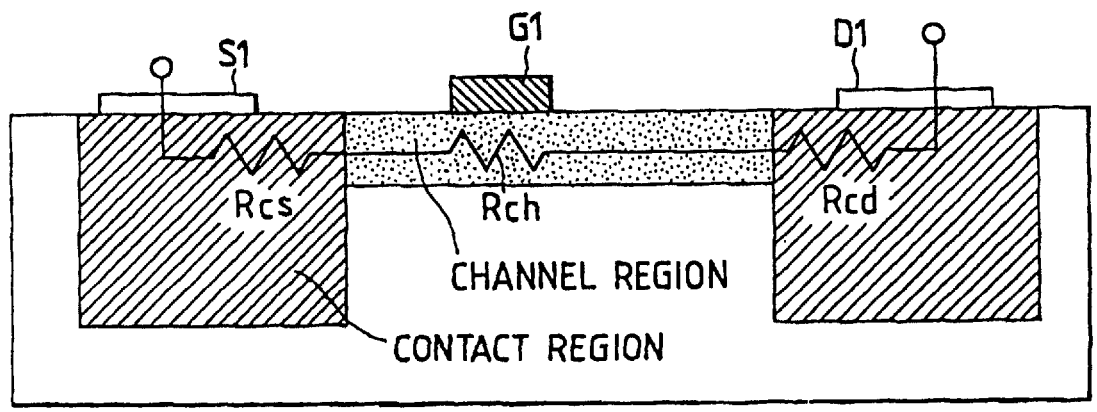
FIG. 11 is a schematic cross section showing a series parasitic resistance of the FET.
Figure 12:
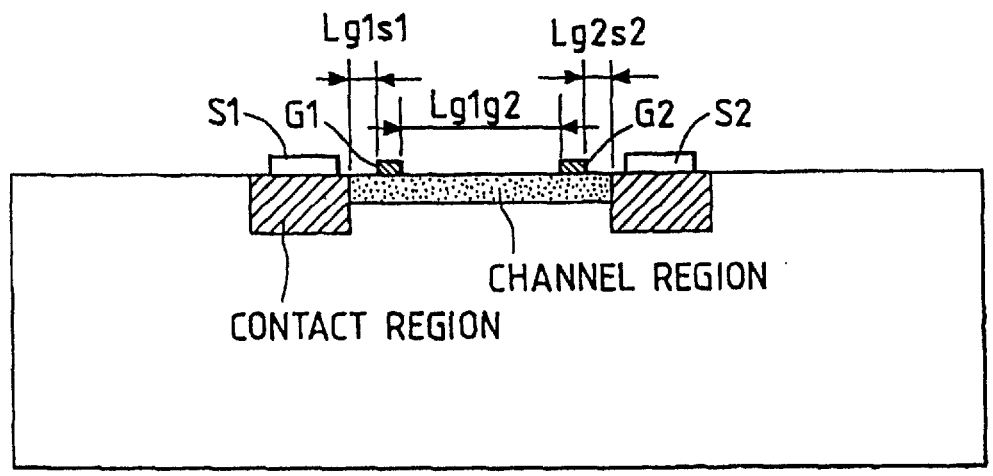
FIGS. 12 and 13 are schematic cross sections of a fourth embodiment of this invention.
Figure 13:
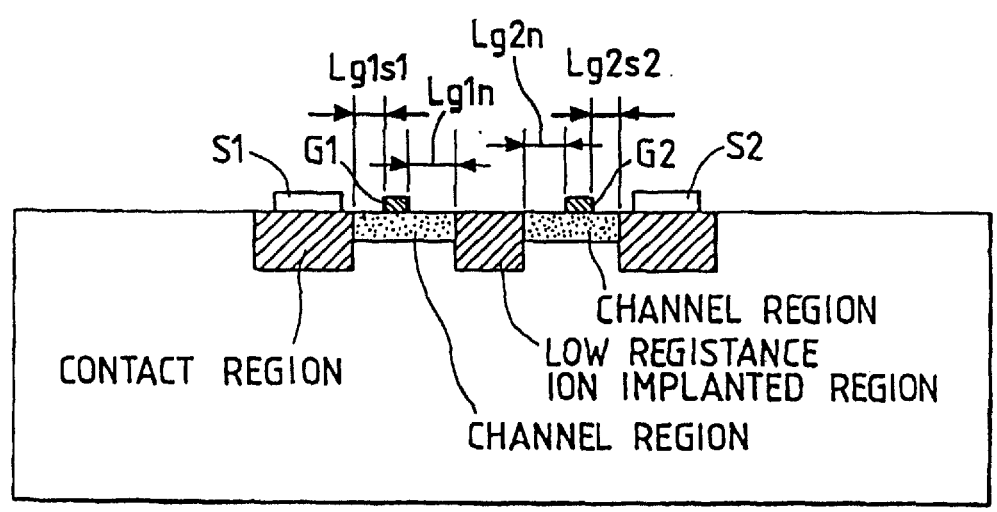

The fourth embodiment of this invention is described by referring to FIGS. 11, 12 and 13. This embodiment concerns a transistor structure that realizes series-connected FETs suited for application to the first embodiment and which can realize reduction in the parasitic resistance in the ON-state FETs more effectively than can the third embodiment. The series parasitic resistance when the FETs turn on is formed of a series connection of a source contact resistance Rcs, a channel resistance Rch and a drain contact resistance Rcd, as shown in FIG. 11. Hence, in the case of the third embodiment shown in FIG. 10, the series parasitic resistance Rp is given by $$R_p = 2^*(R_{cs} + R_{ch} + R_{cd})$$ (Expression 12)

One of methods of reducing the series parasitic resistance involves eliminating the drain contact layer of the two FETs to directly connect the channel regions of each FET. This special transistor is called a dual gate FET which is often used when connecting a plurality of FETs in series. The series parasitic resistance Rpd in this case is given by $$R_{pd}=2*(R_{cs}+R_{ch})+R_{gg} \quad \text{(Expression 13)}$$

where Rgg is a parasitic resistance between two gates which usually takes a value smaller than 2*Rcd. To improve the breakdown voltage of the dual gate FET, this invention sets the distance Lg1g2 between gate 1 G1 and gate 2 G2 of the dual gate FET longer than the distance Lg1s1 between gate 1 G1 and source 1 S1 or distance Lg2s2 between gate 2 G2 and source 2 S2, as shown in FIG. 12. With this structure, it is possible to improve the distortion characteristic while reducing the series parasitic resistance. The cross sectional structure shown in FIG. 13 has a low-resistance ion implantation between two gates to further reduce Rgg and ON-state resistance. Suppose the distance between the first gate and the ion implantation is Lg1n and the distance between the second gate and the ion implantation region is Lg2n. A relative increase in the parasitic capacitance between the gate 1 G1 and source 1 S1 and between gate 2 G2 and source 2 S2 of the dual gate FET is achieved by the following setting:

$$L_{g1n} \geq L_{1gls1}, L_{g2n} \geq L_{g2a2}$$

While this embodiment concerns a case of the dual gate FET, the essence of this embodiment is to make the parasitic capacitance between the gates at the ends and the source on the outer side (or drain) greater than the parasitic capacitance between the adjoining gates and thereby to reduce distortions by setting the distance between the gates at the ends and the source on the outer side (or drain) shorter than the distance between the adjoining gates. In this respect, this invention is effective for the triple gate FET or FETs with a greater number of gates.

Figure 14A:
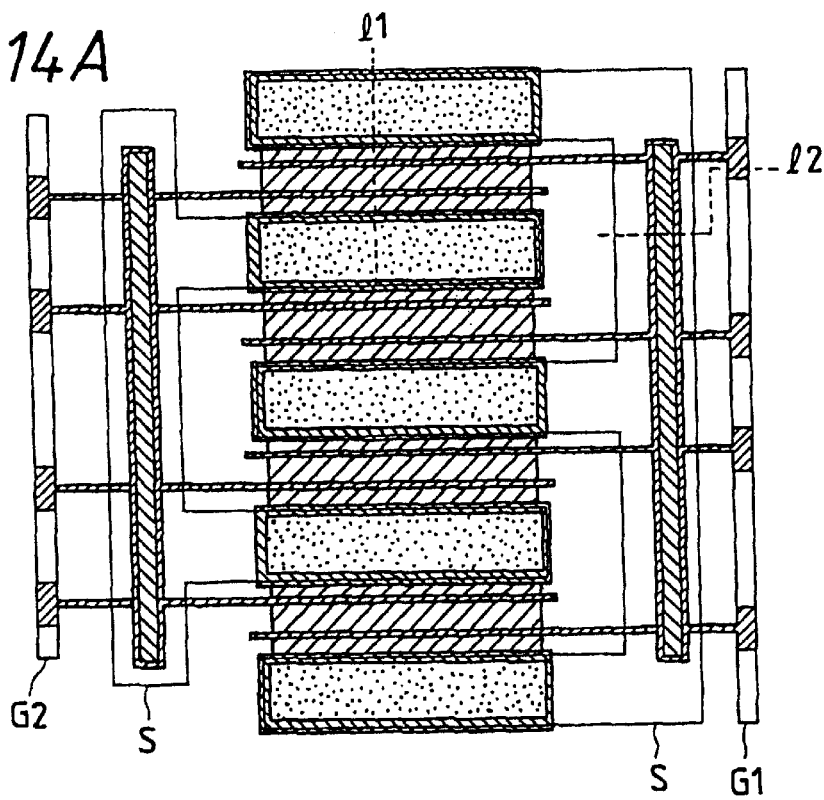
FIGS. 14A, 14B and 14C are schematic views of a fifth embodiment of this invention.
Figure 14B:
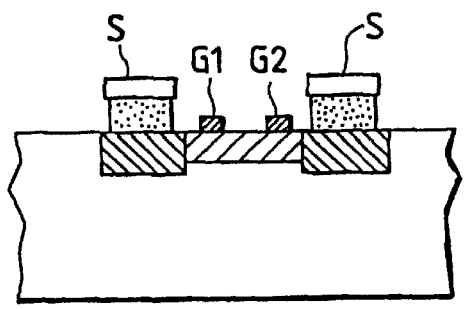
Figure 14C:
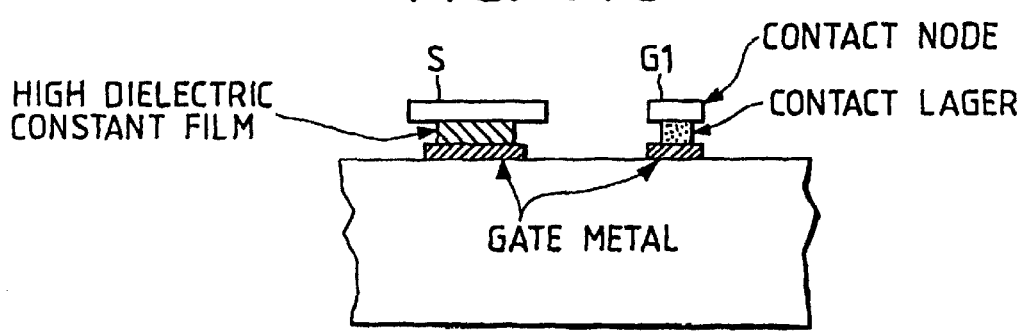

The fifth embodiment of this invention is shown in FIG. 14. This embodiment concerns a device structure which is suited for compactly forming on an integrated circuit distortion prevention capacitors Cp1, Cp2, which are added in this invention. FIG. 14A shows a circuit pattern viewed from above. On two source contact nodes, a high dielectric contact film is formed between a gate metal and a contact node metal to form a capacitor. FIG. 14B shows a cross section of FETs (taken along the line l1) and FIG. 14C a cross section of a capacitor (taken along the line l2). This structure can be easily formed by adding a high dielectric contact film process to the FET process.

Figure 15:
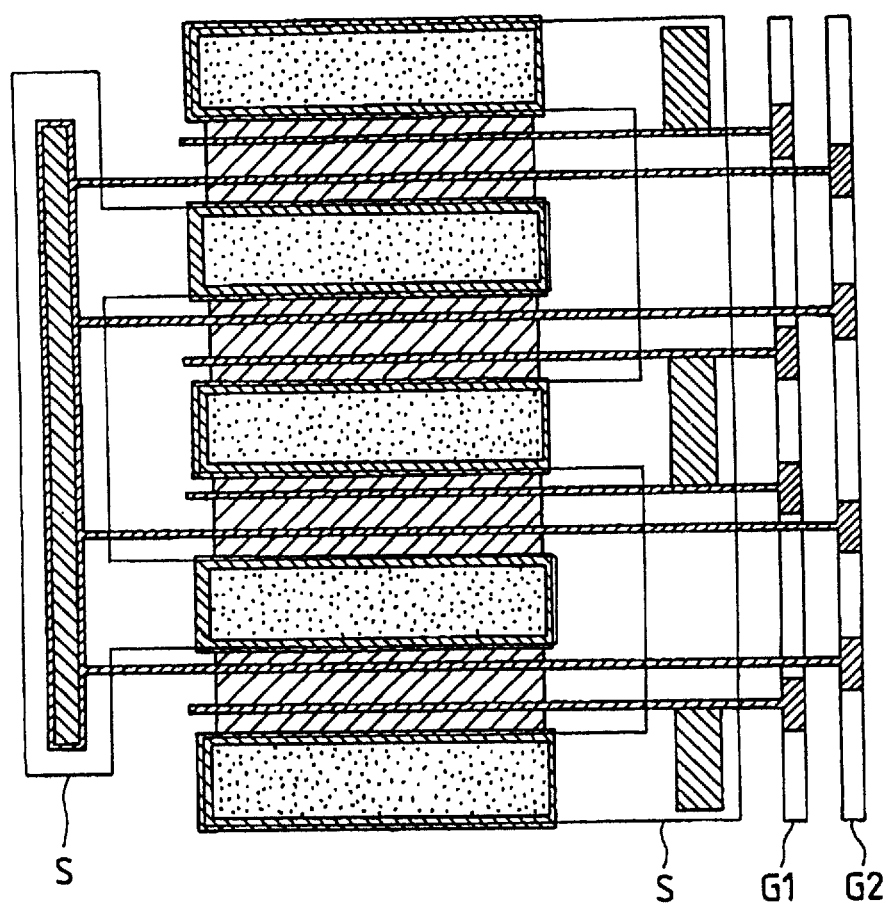
FIG. 15 is a schematic diagram of a sixth embodiment of this invention.

The sixth embodiment of this invention is shown in FIG. 15. This embodiment is similar to the fifth embodiment, except that two gate metals are drawn out in the same direction. The capacitor between the first gate and the source is divided and separated to prevent contact between the two gates. By taking out the two gates from the same direction, it is possible to realize the control wiring for ON/OFF control with ease.

Figure 16:
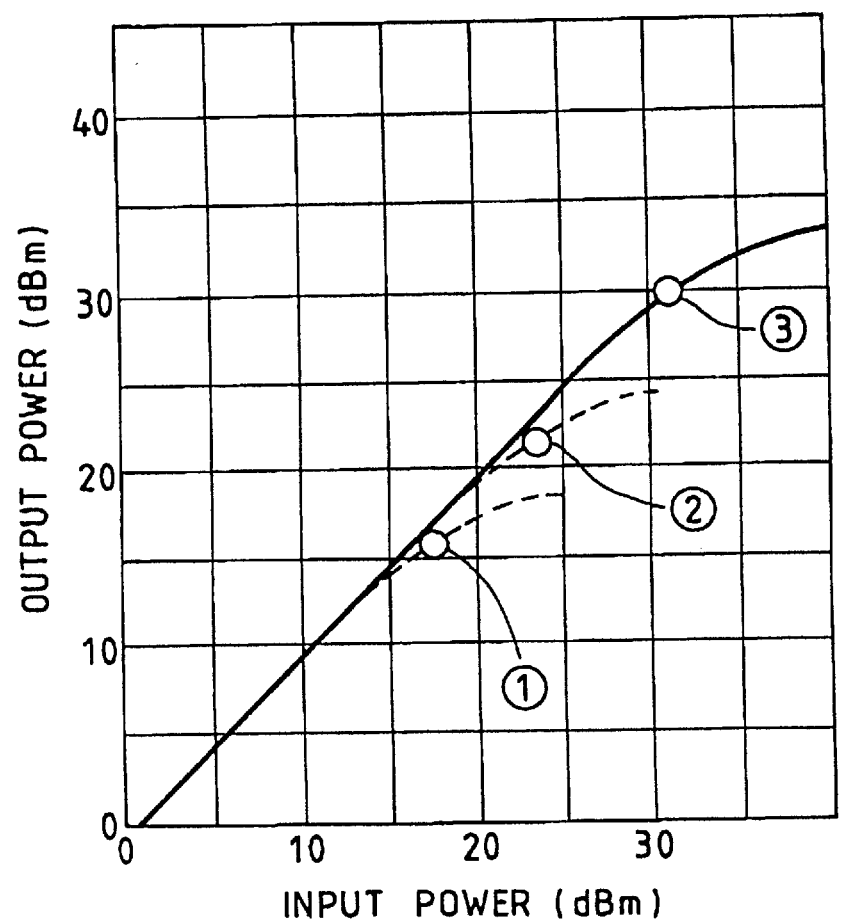
FIG. 16 is a graph showing improvement in the distortion characteristic realized by this invention.
Figure 17A:
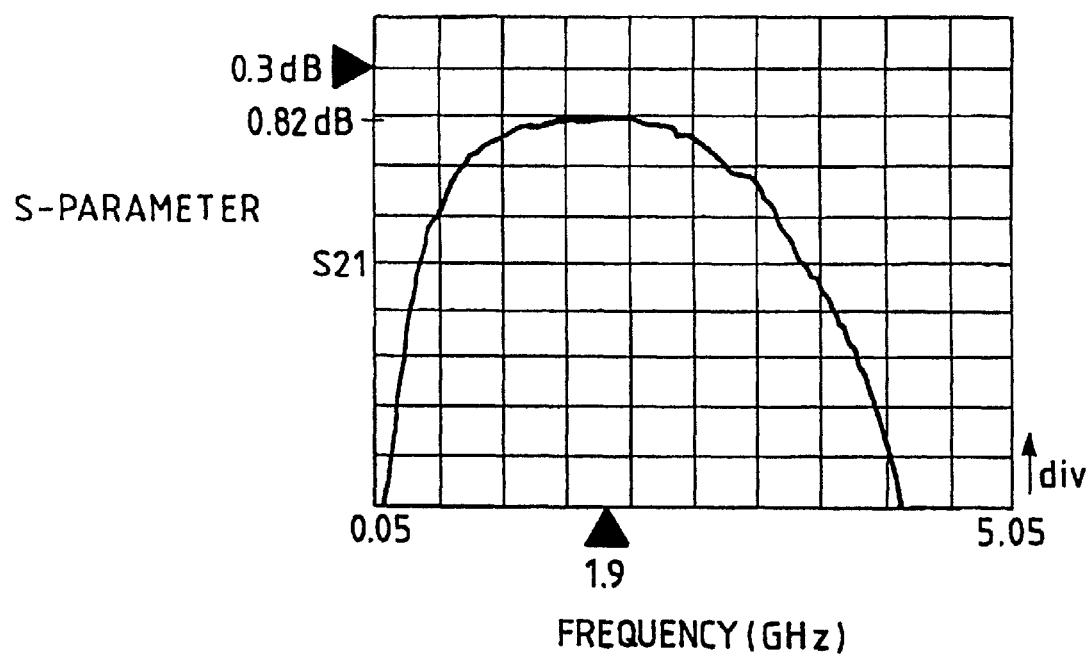
FIGS. 17A and 17B are graphs showing improvements in the isolation characteristic and the insertion loss characteristic, realized by this invention.
Figure 17B:
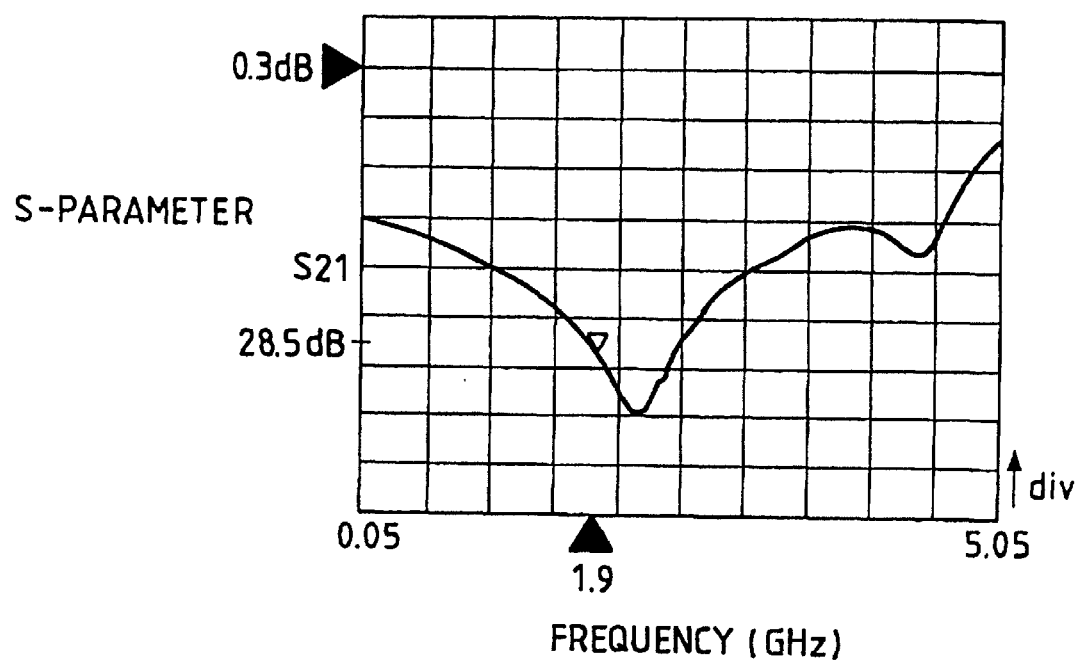

As described above, this invention can easily realize a high frequency switch that has a low voltage and a low distortion characteristic. FIG. 16 shows an improved input-output characteristic of a transmitting signal in the SPDT switch of this invention. This is the result of comparison between three fabricated switches—a conventional SPDT switch, a SPDT switch that applies the dual gate FET of the fourth embodiment of this invention to the OFF-state FET, and a SPDT switch that adds a capacitance of 0.6 pF (Cp1, Cp2) to the dual gate FET of the fourth embodiment and parallelly connects an inductor. The frequency of the transmitting signal is 1.9 GHz. The threshold voltages of all FETs are −2 V, and FETs are applied with 0 V during ON state and with −3 V during OFF state as control bias. The suppressed power of the 1 dB output in the conventional SPDT switch is 17 dBm as indicated by (1) in the graph; the power of the SPDT switch using the dual gate FET of the fourth embodiment is 22 dBm (2); and the power of the SPDT switch, which has an added capacitor and a parallelly connected inductor, reaches 30 dBm (3). FIG. 17A shows the pass characteristic during the ON state and FIG. 17B the isolation characteristic during the OFF state. This invention has realized the insertion loss of 0.82 dB and isolation characteristic of 28.5 dB for the transmitting signal frequency of 1.9 GHz.

We claim:

1. An SPDT switch (single-pole double-throw switch) used in a transceiver for switching between a transmitting mode and a receiving mode, comprising:

a first signal node for outputting a received signal to a receiver;

a second signal node for receiving a received signal from an antenna and outputting a sending signal to the antenna;

a third signal node for receiving a sending signal of high frequency and large power from a transmitter;

a first switch having a first FET provided between a ground level and the first signal node;

a second switch having a second FET and a third FET connected in series between the first signal node and the second signal node;

a third switch having a fourth FET provided between the second signal node and the third signal node; and a fourth switch having a fifth FET and a sixth FET connected in series between the third signal node and the ground level;

wherein the SPDT switch introduces the received signal from the antenna to the receiver by controlling a DC bias applied to gate metals of each FET, turning on the second and fourth switches and turning off the first and third switches, and introduces the sending signal from the transmitter to the antenna by turning off the second and fourth switches and turning on the first and third switches;

wherein the second switch has a source node of the second FET connected to the first signal node, a source node of the third FET connected to the second signal node, and drains of the second FET and the third FET connected together at a first connecting point;

wherein the fourth switch has a source node of the fifth FET connected to the third signal node, a source node of the sixth FET connected to the ground level, and drains of the fifth FET and the sixth FET connected together at a second connecting point;

wherein a first distance between the first connecting point and a gate of the second FET is larger than or equal to a second distance between the source node of the second FET and the gate of the second FET, the first distance being approximately equal to a distance between the first connecting point and a gate of the third FET, and the second distance being approximately equal to a distance between the source node of the third FET and the gate of the third FET; and wherein a third distance between the second connecting point and a gate of the fifth FET is larger than or equal to a fourth distance between the source node of the sixth FET and the gate of the sixth FET, the third distance being approximately equal to a distance between the second connecting point and a gate of the sixth FET, and the fourth distance being approximately equal to a distance between the source node of the sixth FET and the gate of the sixth FET.

2. An SPDT switch used in a transceiver for switching between a transmitting mode and a receiving mode, according to claim 1, wherein the second switch has two capacitors connected between the source node and the gate metal of each of the second and third FETs forming the second switch, and the fourth switch has two capacitors connected between the source node and the gate metal of each of the fifth and sixth FETs forming the fourth switch.

3. An SPDT switch used in a transceiver for switching between a transmitting mode and a receiving mode, according to claim 2, wherein each of the capacitors is formed on source contact nodes by forming a dielectric contact film between a source metal and a gate metal.

4. An SPDT switch used in a transceiver for switching between a transmitting mode and a receiving mode, according to claim 2, further comprising:

an inductor connected in parallel with the second switch; and an inductor connected in parallel with the third switch.

5. An SPDT switch (single-pole double-throw switch) used in a transceiver for switching between a transmitting mode and a receiving mode, comprising:

a first signal node for outputting a received signal to a receiver;

a second signal node for receiving a received signal from an antenna and outputting a sending signal to the antenna;

a third signal node for receiving a sending signal of high frequency and large power from a transmitter;

a first switch having an FET provided between a ground level and the first signal node, the FET having a gate metal;

a second switch having a first dual gate FET, which effectively includes drain nodes of two FETs being connected in a series connection of the two FETs, provided between the first signal node and the second signal node, the first dual gate FET having two gate metals;

a third switch having an FET between the second signal node and the third signal node, the FET having one gate metal; and a fourth switch having a second dual gate FET, which effectively includes two drain nodes of two FETs being connected in a series connection of the two FETs, between the third signal node and the ground level, the second dual gate FET having two gate metals;

wherein the SPDT switch introduces the received signal from the antenna to the receiver by controlling a DC bias applied to gate metals of each FET, turning on the second and fourth switches and turning off the first and third switches, and introduces the sending signal from the transmitter to the antenna by turning off the second and fourth switches and turning on the first and third switches; and wherein the second switch and the fourth switch are formed in such a way that the two gate metals of the first and second dual gate FETs are arranged parallelly on a common channel region, that two source nodes of the first and second dual gate FETs are arranged on a contact region on the outside of the channel region, and that the distance between the gate metals is longer than or equal to the distance between the adjacent gate metal and source node.

6. An SPDT switch used in a transceiver for switching between a transmitting mode and a receiving mode, according to claim 5, wherein the second switch has two capacitors connected between the adjacent source node and gate metal of the first dual gate FET, and the fourth switch has two capacitors connected between the adjacent source node and drain node of the second dual gate FET.

7. An SPDT switch used in a transceiver for switching between a transmitting mode and a receiving mode, according to claim 6, wherein each of the capacitors is formed on source contact nodes by forming a dielectric contact film between a source metal and a gate metal.

8. An SPDT switch used in a transceiver for switching between a transmitting mode and a receiving mode, according to claim 6, further comprising:

an inductor connected in parallel with the second switch; and an inductor connected in parallel with the third switch.

9. An SPDT switch (single-pole double-throw switch) used in a transceiver for switching between a transmitting mode and a receiving mode, comprising:

a first signal node for outputting a received signal to a receiver;

a second signal node for receiving a received signal from an antenna and outputting a sending signal to the antenna;

a third signal node for receiving a sending signal of high frequency and large power from a transmitter;

a first switch having an FET provided between a ground level and the first signal node, the FET having a gate metal;

a second switch having a first dual rate FET, which effectively includes drain nodes of two FETs being connected in a series connection of the two FETs, provided between the first signal node and the second signal node, the first dual rate FET having two gate metals;

a third switch having an FET between the second signal node and the third signal node, the FET having one gate metal; and a fourth switch having a second dual gate FET, which effectively includes drain nodes of two FETs being connected in a series connection of the two FETs, between the third signal node and the ground level, the second dual gate FET having two gate metals;

wherein the SPDT switch introduces the received signal from the antenna to the receiver by controlling a DC bias applied to gate metals of each FET, turning on the second and fourth switches and turning off the first and third switches, and introduces the sending signal from the transmitter to the antenna by turning off the second and fourth switches and turning on the first and third switches; and wherein the second switch and the fourth switch are formed in such a way that the two gate metals of the first and second dual gate FETs are arranged parallelly on a channel region on the outside of an ion implantation, that two source nodes of the first and second dual gate FETs are arranged on a contact region on the outside of the channel region, that the distance between one of the gate metals and the ion implantation is longer than the distance between the one gate metal and one of the source nodes adjacent to it and that the distance between the other gate metal and the ion implantation is longer than the distance between the other gate metal and the other source node adjacent to it.

10. An SPDT switch used in a transceiver for switching between a transmitting mode and a receiving mode, according to claim 9, wherein the second switch has two capacitors connected between the adjacent source node and gate metal of the first dual gate FET, and the fourth switch has two capacitors connected between the adjacent source node and drain node of the second dual gate FET.

11. An SPDT switch used in a transceiver for switching between a transmitting mode and a receiving mode, according to claim 10, wherein each of the capacitors is formed on source contact nodes by forming a dielectric contact film between a source metal and a gate metal.

12. An SPDT switch used in a transceiver for switching between a transmitting mode and a receiving mode, according to claim 10, further comprising:

an inductor connected in parallel with the second switch; and an inductor connected in parallel with the third switch.

* * * * *